United States Patent [19]
Duttweiler

[11] Patent Number: 5,566,167
[45] Date of Patent: Oct. 15, 1996

[54] SUBBAND ECHO CANCELER

[75] Inventor: Donald L. Duttweiler, Rumson, N.J.

[73] Assignee: Lucent Technologies Inc., Murray Hill, N.J.

[21] Appl. No.: 368,687

[22] Filed: Jan. 4, 1995

[51] Int. Cl.$^6$ .................................................. H04B 3/21
[52] U.S. Cl. ........................ 370/32.1; 379/411; 379/410
[58] Field of Search ............................. 370/32.1, 100.1, 370/32; 379/406, 410, 407, 408, 409, 411; 333/18, 28 R; 364/724.01, 724.19, 728.03; 381/71, 63, 64; 375/220, 229, 230, 232, 227, 254, 354, 355, 356, 358, 349, 350, 209, 210

[56] References Cited

U.S. PATENT DOCUMENTS

| 3,500,000 | 3/1970 | Kelly, Jr. et al. | 379/410 |
|---|---|---|---|
| 5,136,577 | 8/1992 | Amano et al. | 370/32.1 |
| 5,272,695 | 12/1993 | Makino et al. | 370/32.1 |
| 5,351,291 | 9/1994 | Menez et al. | 370/32.1 |
| 5,428,605 | 6/1995 | André | 370/32.1 |

OTHER PUBLICATIONS

"A Twelve–Channel Digita Echo Canceler", Duttweiler, 1978, pp 647–653.
"A New Technique for the Design of Non–Recursive Digital Filter", Hofstetter et al. pp 64–72.
"Adaptive Filtering in Subbands with Centical Sampling: Analysis, Experiments, and Application to Acoustic Echo Cancellation", Gilloire et al., 1992, pp 1862–1875.
"Numerical Recipes in C", Press et al. 1988, pp 394–420.

Primary Examiner—Douglas W. Olms
Assistant Examiner—Dang Ton
Attorney, Agent, or Firm—Thomas Stafford

[57] ABSTRACT

Failure to cancel echos at frequencies in which the frequency characteristics of sub-band filters in the X and Y analysis filter banks overlag in subband echo cancelers is overcome by employing an X-analysis filter bank in which the pass-band of the subband filters is wider than the pass-band of the corresponding subband filters in the Y-analysis filter bank. This insures that there is sufficient energy in the tap delay lines of the adaptive filters in the subband echo cancelers at all frequencies where echos are to be synthesized. More specifically, the keeping of sufficient energy in the tap delay lines of the adaptive filters in the subband echo cancelers avoids exciting eigenmodes associated with the small eigenvalues of the correlation matrix.

19 Claims, 6 Drawing Sheets

SUBBAND ECHO CANCELER

TECHNICAL FIELD

This invention relates to echo cancelers and, more particularly, to subband echo cancelers.

BACKGROUND OF THE INVENTION

In a subband implementation of an echo canceler, or more generally, any adaptive filter, the signals to be processed, i.e., a receive signal and a transmit signal, are first decomposed into an array of frequency bands and, then, processing is done on a per-band basis. To this end, an X-analysis filter bank is employed to decompose the receive signal x(k) into a predetermined number of frequency bands and a Y-analysis filter bank is employed to decompose the transmit signal y(k) into a similar number of frequency bands. Then, the The X and Y subband signals are supplied to an echo canceler in each respective subband in order to cancel echos in the respective subbands. One such subband echo canceler is disclosed in U.S. Pat. No. 5,272,695 issued Dec. 21, 1993.

In prior subband echo cancelers, the X and Y filters in the X and Y analysis filter banks and were identical. That is, they had identical frequency characteristics and, consequently, there was overlap in the roll-off regions of the frequency characteristics. It has been observed that the prior subband echos cancelers using such filters in the X and Y analysis filter banks with identical frequency characteristics for the subbands suffer in convergence performance. Indeed, poor convergence at band edges, that is, at frequencies covered roughly equally by two adjacent subbands has been observed. An explanation for the poor band-edge convergence is that the correlation matrices of subsampled perband reference signals (that is, the X subband signals running down the tap delay lines of the echo cancelers in each subband) are ill conditioned with small eigenvalues. If eigenmodes associated with these small eigenvalues are excited, there will inevitably be long time constants introduced into the convergence of the echo cancelers in the subbands. The result is that there is practically no convergence of the subband echo cancelers in the transition regions between subbands. This is extremely undesirable.

SUMMARY OF THE INVENTION

The problems associated with prior subband echo cancelers are overcome by employing an X-analysis filter bank in which the pass-band of the subband filters is wider than the pass-band of the corresponding subband filters in the Y-analysis filter bank. This insures that there is sufficient energy in the tap delay lines of the adaptive filters in the subband echo cancelers at all frequencies where echos are to be synthesized. More specifically, the keeping of sufficient energy in the tap delay lines of the adaptive filters in the subband echo cancelers avoids exciting eigenmodes associated with the small eigenvalues of the correlation matrix.

DETAILED DESCRIPTION

SUBBAND ECHO CANCELER

Figure 1:
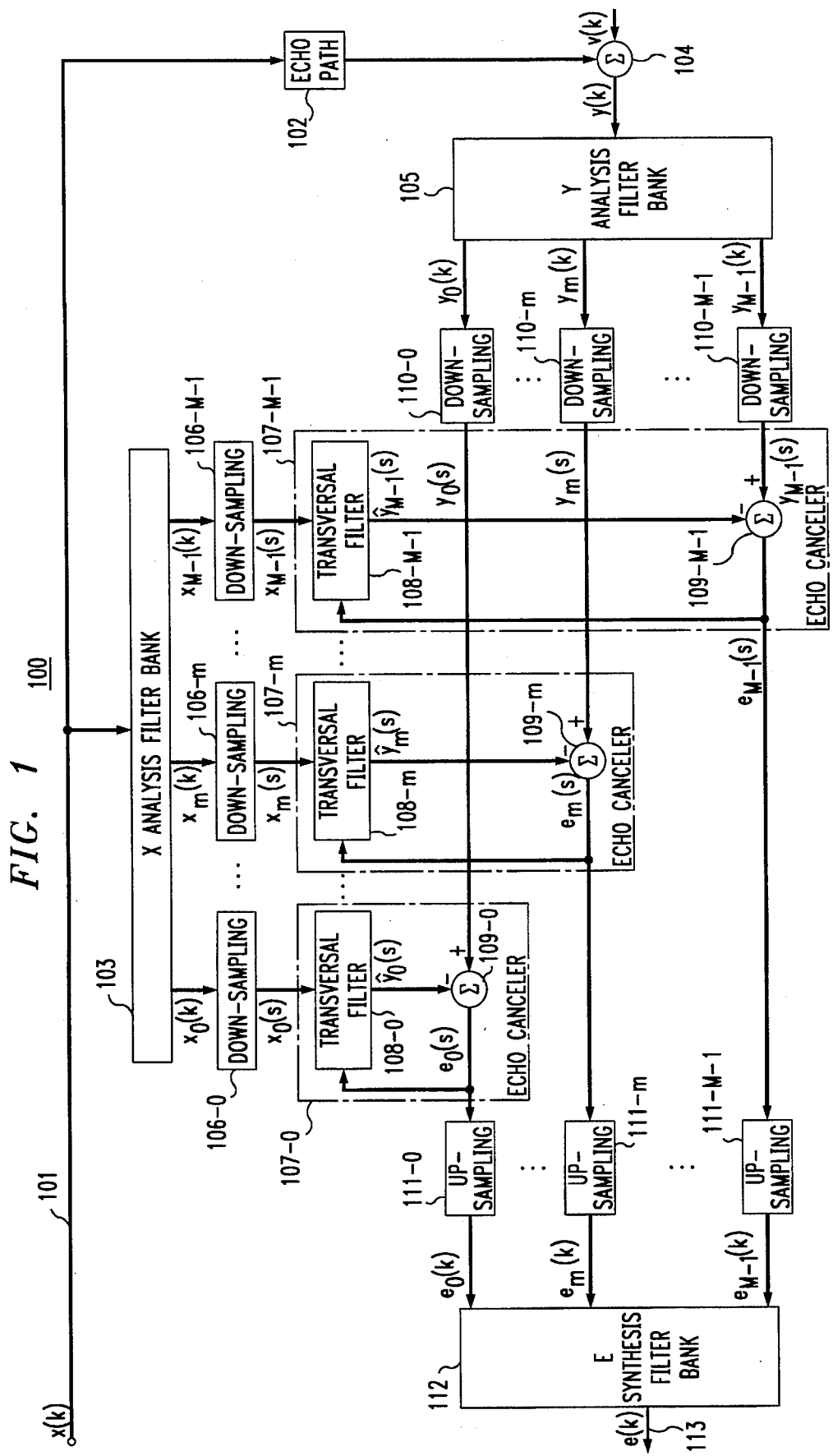
FIG. 1 shows, in simplified block diagram form, details of a subband echo canceler in which the invention can be employed.

FIG. 1 shows, in simplified block diagram form, details of a subband echo canceler 100 in which the invention can be employed. It is noted that the processing of the signals is in digital form and that any analog-to-digital and digital-to-analog converters are not shown. Specifically, a received signal x(k) is supplied via received path 101 to echo path 102 and X analysis filter bank 103. An outgoing voice signal v(k) is combined via summer 104 with an echo signal from echo path 102 to form outgoing near-end signal y(k). It is noted that echo path 102 maybe electrical or acoustical in nature. If the echo path is acoustical it is obvious that the summing is done at the microphone or the like rather than an electrical path. Summer 104 is merely illustrative that there is a combination of the voice signal and the echo path signal and is not a physical summer per say. The near-end signal is supplied to Y analysis filter bank 105. The X and Y analysis filter banks 103 and 105 are employed to decompose the received signal x(k) and the near-end signal y(k), respectively, into a plurality of subbands. In this example, the number of subbands in the X analysis filter bank 103 and the Y analysis filter bank 105 are equal. The subband signals $x_m(k)$, where m=0, . . . , M−1 and in a specific example M=32, from X analysis filter bank 103 are supplied to down-sampling units 106-0 through 106-M−1 where they are down-sampled as described below. In turn, the resulting down-sampled signals $x_0(s)$ through $x_{M-1}(s)$ are supplied to echo cancelers 107-0 through 107-M−1 and, therein, to transversal filters 108-0 through 108-M−1, respectively. Echo cancelers 107-0 through 107-M−1 also include algebraic combining units 109-0 through 109-M−1, respectively, which are supplied with echo estimate signals $\hat{y}_0(s)$ through $\hat{y}_{M-1}(s)$, respectively. The subband signals $y_m(k)$, where m=0, . . . , M−1 and in a specific example M=32, from Y analysis filter bank 105 are supplied to down-sampling units 110-0 through 110-M−1 where they are down-sampled as described below. In turn, the resulting down-sampled signals $y_0(s)$ through $y_{M-1}(s)$ are supplied to echo cancelers 107-0 through 107-M−1 and, therein, to algebraic combiners 109-0 through 109-M−1, respectively, where the echo estimates $\hat{y}_0(s)$ through $\hat{y}_{M-1}(s)$ are subtracted therefrom to cancel the echoes in the subbands. Such echo cancelers are well known in the art and adaptive filters 108 are typically adaptive transversal filters of a type broadly described in U.S. Pat. No. 3,500,000 and also, in an article authored by D. L. Duttweiler, entitled "A Twelve-Channel Digital Echo Canceler", *IEEE Transactions on Communications*, VOL.COM-26, No. 5, May 1978, pages 647–653. The resulting sub-Sampled error signals $e_0(s)$ through $e_{M-1}(s)$ from echo cancelers 107-0 through 107-M−1 are supplied to up-sampling units 111-0 through 111-M−1, respectively. The up-sampled error signals $e_0(k)$ through $e_{M-1}(k)$ are supplied to E synthesis filter bank 112 where they are recombined to form error signal e(k). Such subband echo cancelers are known in the art, one of which is disclosed in U.S. Pat. No. 5,272,695 issued Dec. 21, 1993.

Figure 2:
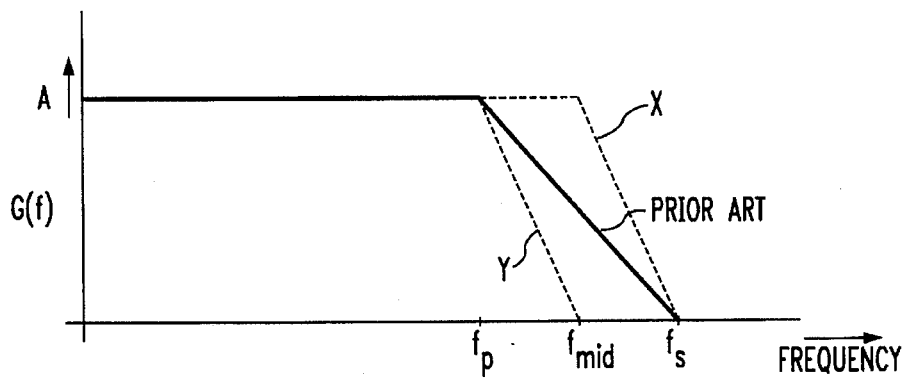
FIG. 2 is a graphical representation of the ideal frequency characteristics of the X and Y filters used in the X and Y analysis filter banks of FIG. 1 and their relationship to the prior art frequency characteristics.
Figure 3:
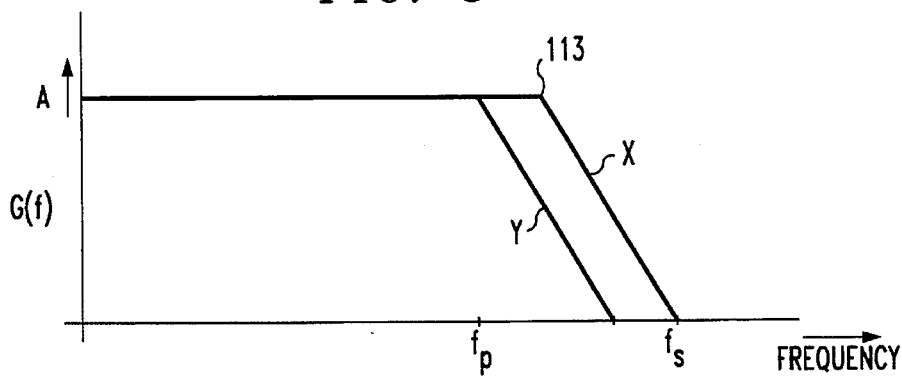
FIG. 3 is a graphical representation of more practical frequency characteristics of the X and Y filters used in the X and Y analysis filter banks of FIG. 1.

As indicated in more detail below, it is important that the signals in the tap delay lines in adaptive filters 108-0 through 108-M−1 have strong spectral energy at any frequencies where there is even weak spectral energy in the signals $y_m(k)$. Achieving this end requires careful design of the bandpass filters employed in the X and Y analysis filter banks 103 and 105. Referring to FIG. 2, there is shown frequency characteristics of low-pass prototype filters which can readily be expanded into bandpass filters. Shown is the ideal frequency characteristic for X filters employed in X analysis filter bank 103 and the ideal filter characteristic for Y filters employed in Y analysis filter bank 105 and their relationship to the frequency characteristics of prior X and Y filters. Note that the prior X and Y filters had identical frequency characteristics which led to the problem of not being able to cancel echoes at frequencies in the overlap region of the X and Y bandpass filters. The ideal solution would be as shown in FIG. 2 to have the passband of the X filters be wider than the passband of the Y filters so that there would always be energy available in the tap delay lines of adaptive filters 108 in order to be able to synthesize the appropriate echo estimates in the subbands at frequencies in the overlap region of the bandpass filters. To this end, the frequency characteristics of the Y filters in Y analysis filter bank 105 start to roll off at approximately frequency $f_p$ and cut off at approximately frequency $f_{mid}$ while the frequency characteristics of the X filters in the X analysis filter bank 103 start to roll off at approximately frequency $f_{mid}$ and cut off at approximately frequency $f_s$. In this example, $f_p$ is $0.5/M$, $f_s$ is $0.5/S$ where S is the sub-sampling rate and $f_{mid}$ is mid-way between $f_p$ and $f_s$. Note that both of the X and Y filter frequency characteristics must be cut off by frequency $f_s$. Such ideal frequency characteristics for the X and Y filters as shown in FIG. 2, however, come at an increased expense because of the length of the filters that are required. In order to reduce the length of the filters, i.e., the number of taps required and, hence, their cost, compromise frequency characteristics are employed for the X and Y filters as shown in FIG. 3. As shown, the frequency characteristic of the Y filter begins to roll off at frequency $f_p$ and cuts off at a frequency approximately two thirds of the way between frequency $f_p$ and $f_s$ and the roll off of the X filter frequency characteristic begins at a frequency approximately one third of the way between $f_p$ and $f_s$ and cuts off at approximately frequency $f_s$. In practical filters it is noted that the roll off will be approximately 3 dB down at the roll off points.

Figure 4:
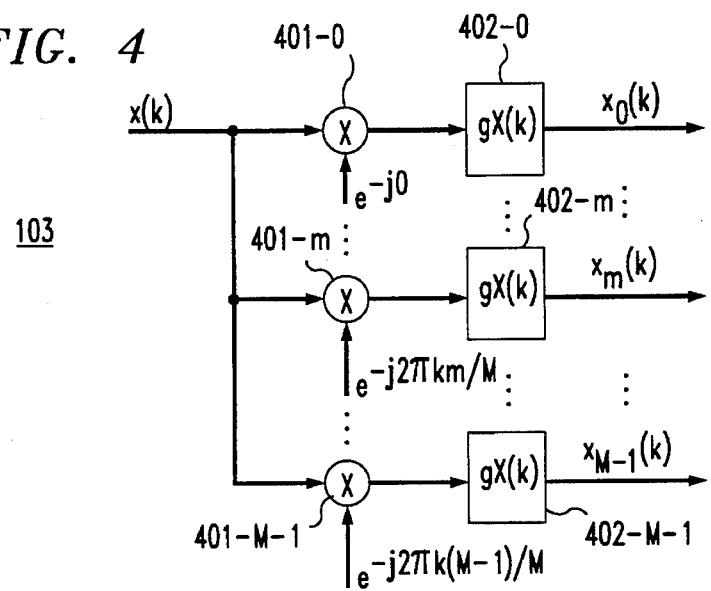
FIG. 4 shows, in simplified block diagram form, details of the X analysis filter bank of FIG. 1.

FIG. 4 shows, in simplified block diagram form, details of X analysis filter bank 103 of FIG. 1. It is noted that the Y analysis filter bank will include essentially identical elements with the only difference being the frequency characteristic of the filters 402. Shown, is received signal x(k) being supplied to multipliers 401-0 through 401-M−1 with the generalized multiplier being 401-m. Each of multipliers 401 is supplied with a signal represented by $e^{-j2\pi km/M}$, again where m=0, ..., M−1 to obtain the $m^{th}$ such heterodyned down signal. The heterodyned down output signals from multipliers 401-0 through 401-M−1 are supplied to bandpass filters 402-0 through 402-M−1, respectively, which yield the subband signals $x_0(k)$ through $x_{M-1}(k)$, respectively. The design procedure and details of the filters employed in the X and Y filters of X and Y analysis filter banks 103 and 105, respectively, are described in detail below.

Figure 5:
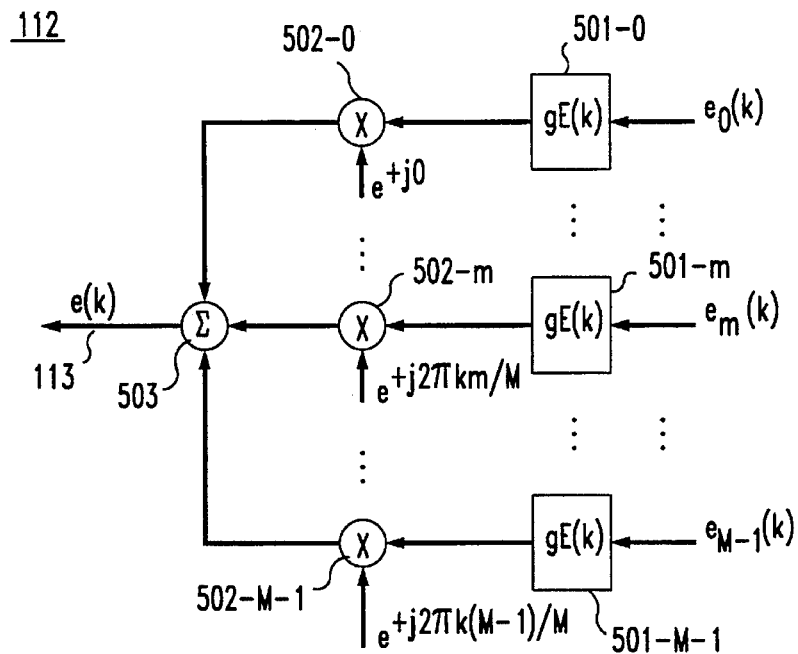
FIG. 5 shows, in simplified block diagram form, details of the E synthesis filter bank of FIG. 1.

FIG. 5, shows in simplified block diagram form, details of E synthesis filter bank 112 of FIG. 1. It should be noted that the E filter 501 employed in E synthesis filter bank 112 are typically identical to the Y filters in Y analysis filter bank 105, the design of which is described below. Specifically, the up-sampled error signals $e_0(k)$ through $e_{M-1}(k)$ are supplied to E filters 501-0 through 501-M−1, respectively, with the generalized multiplier being 502-m. The filtered versions of the error signals $e_0(k)$ through $e_{M-1}(k)$ are supplied from multipliers 502-0 through 502-M−1, respectively, where they are heterodyned up by a signal supplied to each of the multipliers 502 which is represented by $e^{+j2\pi km/M}$, where m=0, ..., M−1 to obtain the $m^{th}$ such heterodyned up signal. The heterodyned up output signals from multipliers 502-0 through 502-M−1 are supplied to algebraic summer 503 where they are combined to yield the desired output error signal e(k) on transmit path 113.

FILTER DESIGN

None of the many existing techniques for designing finite impulse response (FIR) filters were capable of designing filters as described below. To meet this need, a new FIR design methodology was developed, which is called Z-plane alternation. It is general, powerful, and efficient. Both linear-phase and minimum-phase filters can be designed. Additionally, it is possible to accommodate almost any reasonable constraints on

• the shape of the time-domain impulse response,

• the shape of the frequency-domain transfer function, and

• the location or symmetry of zeros in the Z-plane.

Z-plane alternation is computationally efficient and with reasonable care does not generally suffer from problems with local versus global minima or round-off due to finite-precision arithmetic.

The presentation here will assume the design of a filter basically low-pass in nature. There is, however, an obvious generalization for bandpass and high-pass filters.

The key idea behind Z-plane alternation is to alternately optimize over the Z-plane locations of stopband zeros and the Z-plane locations of passband zeros. The stopband zeros are located via the now classic Remez-exchange-like algorithm described in an article authored by Hofstetter et al., entitled "A New Technique For The Design of Non-recursive Digital Filters", *The Fifth Annual Princeton Conference: Information Sciences and Systems*, pp. 64–72, March 1971. Thus, the resulting filters are optimal in the sense that the worst-case stopband rejection is the best possible for the specified number of stopband zeros.

The passband zeros are located by minimizing a cost function. In our application we have found the Powell algorithm described in a book authored by W. H. Press, S. A. Teukolsky, W. T. Vetterling and B. P. Flannery and entitled "Numerical Recipes", second edition, Cambridge University Press, 1992, to be quite satisfactory despite its simplicity.

Since, the cost function need not be linear and a Z-plane characterization can be transformed to a time-domain impulse response or a frequency-domain transfer function, time-domain and frequency-domain requirements can be accommodated almost as readily as Z-plane requirements. Minimizations of nonlinear cost functions are notorious for often becoming stuck in local minima. With care, however, we have generally been able to avoid such problems in our applications to date. A desire to keep the $750^{th}$ sample of a 1000 sample impulse response small in magnitude would lead to a horrendously bumpy cost function parameterized in the Z-plane. Coming up with examples like this where the design goal is more reasonable is much more difficult, however, whereas many common objectives such as minimizing passband ripple, insuring a smooth hand-off between bands in a filter bank, and minimizing delay can with care lead to comparatively smooth cost functions of zero locations.

The fact that passband zeros are generally much less numerous than total zeros is also important in keeping run times reasonable. Numerical optimization algorithms have complexities and instruction counts increasing rapidly with the number of free parameters. Our experience suggests there is a practical limit of about 25 on this number.

Since the passband zeros are in the complex plane, it takes two parameters to specify a location for one. However, if, it is assumed that the filter tap coefficients are all to be real, then any zeros off the real axis must come in complex-conjugate pairs. This brings the number of free parameters down to roughly the number of passband zeros. A further reduction by a factor of two is realized in designs constrained to be linear in phase. No passband zeros would ever be located on the unit circle, and in linear-phase designs, any zero off the unit circle at $re^{j2\pi\theta}$ must have a mating zero at $(1/r)e^{j2\pi\theta}$.

Z-PLANE OPTIMIZATION

Alternating Between Stopband Zero and Passband Zero Optimization

Figure 6:
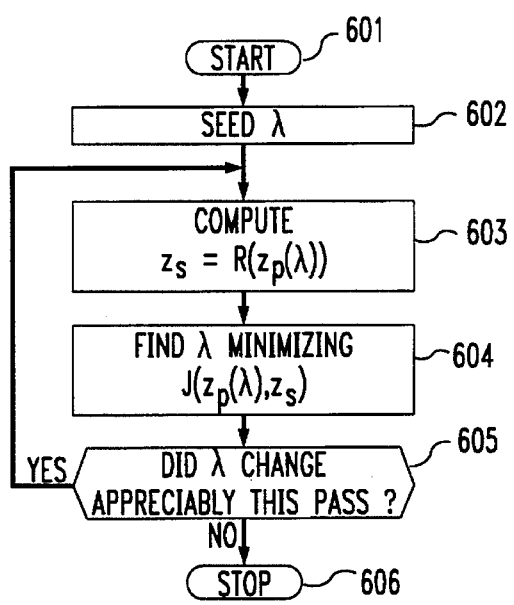
FIG. 6 is a flow chart illustrating the steps of the Z-plane alternation design procedures.

FIG. 6 shows a flow diagram for the Z-plane alternation design procedure. The routine is started via step 601. Thereafter, in step 602 an initial guess $\lambda$ is made of the $N_\lambda$ dimensional vector of free parameters (vectors are shown in a bold typeface). The $Z_P$ dimensional vector $z_P$, ($\lambda$) of passband zeros specified by this particular $\lambda$ in turn specifies a $Z_s$ dimensional vector $$z_S = R(z_P(\lambda)) \quad (1)$$

of stopband zeros which is computed in step 603. The function R minimizes the worst-case stopband rejection. A Remez-exchange-like procedure is used to compute this function for any given vector $z_P$ of passband zeros. The cost function to be minimized is a function $J(z_P(\lambda), z_S)$ of the locations of the passband and stopband zeros. A new vector $\lambda$ of free parameters is computed in step 604 by searching for the minimum, that is, $$\lambda = \lambda' \epsilon R^{N_\lambda} : J(z_P(\lambda'), z_S) \text{ is minimum.} \quad (2)$$

In this search, the vector $z_S$ is held constant rather than being reevaluated as $z_S = R(z_P(\lambda'))$ each time a new candidate location $\lambda'$ is tested. The return loop shown in FIG. 6 compensates. Once a new free parameter vector $\lambda$ is found in step 605, control is returned to step 603 and steps 603 to 605 are iterated to compute a new vector of stopband zeros via Remez exchange. This process is iterated until step 605 indicates that there is no appreciable change in $\lambda'$. It, in turn, enters as a constant in another cost function optimization.

Experience has shown that it is only necessary to iterate in this fashion ten or fewer times before a stable point is reached. Alternatively, only one pass through the loop can be made but evaluating the cost function $$J(z_P(\lambda'), R(z_P(\lambda'))) \quad (3)$$

for each minimum candidate $\lambda'$. Computational time is likely to be substantially less, however, with the looped algorithm shown.

Stopband Optimization

Any given vectors $z_P$ and $z_S$ of passband and stopband zeros define a transfer function $H(f; z_P, z_S)$ where $f$ is normalized frequency. Let $f_S$ denote the lower limit of the stopband for a low-pass filter and let $$\delta(z_P, z_S) = \max_{f \in [f_S, 0.5]} |H(f; z_P, z_S)| \quad (4)$$

In other words $\delta(z_P, z_S)$ is the worst case stopband loss. For a given vector $z_P$, of passband zero locations, there is a unique vector $z_S$ minimizing $\delta(z_P, z_S)$. We define $R(z_P)$ as the function mapping $z_P$ to $z_S$ in this way.

The procedure we use to find $z_S$ is similar to one first described by Hofstetter, Oppenheim, and Seigel, noted above.

Using for conciseness the notation $H(f)$ instead of $H(f; z_P, z_S)$, we can write $$H(f) = H_P(f) H_S(f) \quad (5)$$

where $$H_P(f) = \prod_{n=0}^{Z_P-1} (e^{j2\pi f} - z_{P,n}) \quad (6)$$

and $$H_S(f) = \prod_{n=0}^{Z_S-1} (e^{j2\pi f} - z_{S,n}). \quad (7)$$

In these equations $z_{P,n}$ and $z_{S,n}$ denote the nth components of the vectors $z_P$ and $z_S$. Notice that we number the elements of an N dimensional vector from 0 to N−1, which is the C programming language convention, rather than the more customary 1 to N. In locating the stopband zeros, the passband zeros are fixed so that $H_p(f)$ is a known function.

It is assumed that optimally located stopband zeros always lie on the unit circle and the search is restricted to the unit circle. Intuitively this is entirely reasonable as for a frequency $f$ near the frequency $f_0$ of a zero at $r_0 e^{j2\pi f_0}$, stopband rejection always improves as $r_0$ is driven towards 1.

Since it has been assumed that the desired impulse response is real valued, any stopband zeros with non-zero imaginary components must come in complex-conjugate pairs. In principle, there could be any multiplicity of stopband zeros at −1, but again from geometric intuition it is clear that there would never be any advantage in having more than one.

Figure 7:
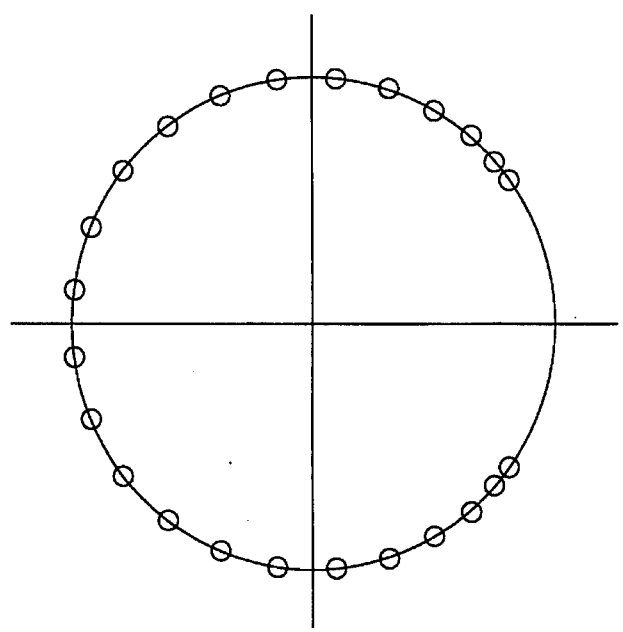
FIG. 7 graphically illustrates a typical stopband zero pattern for a filter design with $Z_S$ even.
Figure 8:
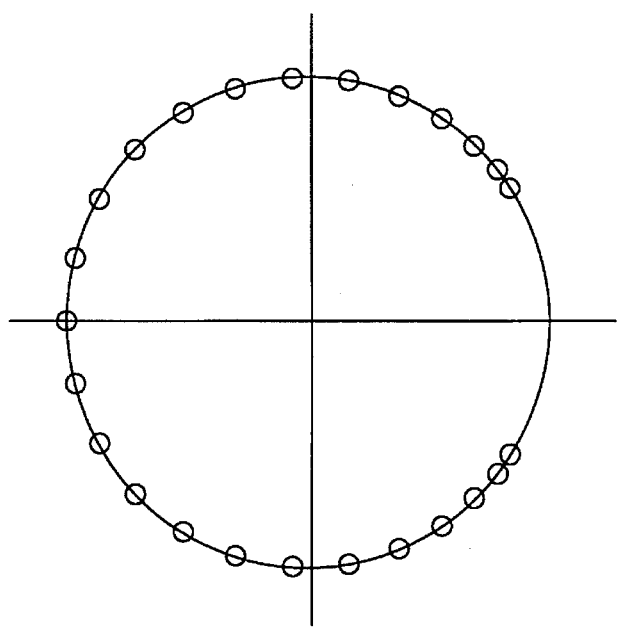
FIG. 8 graphically illustrates a typical stopband zero pattern for a filter design with $Z_S$ odd.

There is a fundamental distinction between designs with $Z_S$ even and $Z_S$ odd. Let $$Z_S = 2Q_S + R_S \quad (8)$$

where $R_S$ is 0 or 1 as $Z_S$ is even or odd. If $Z_S$ is even, optimal designs will have $Q_S$ pairs of complex-conjugate zeros as shown in FIG. 7. If $Z_S$ is odd, there will be one real zero in addition to the $Q_S$ complex-conjugate pairs as shown in FIG. 8.

Let $$0 < f_S < \theta_0 < \theta_1 < \ldots < \theta_{Q_{S}-1} \leq 0.5 \quad (9)$$

denote the stopband zero frequencies. Considering first the case where $Z_S$ is even, we have $$|H(f)| = |H_P(f)| \prod_{n=0}^{Q_S-1} |(e^{j2\pi f} - z_{S,n})(e^{j2\pi f} - z_{S,n}^*)| \quad (10)$$

$$= |H_P(f)| 2^{Q_S} \prod_{n=0}^{Q_S-1} |\cos(2\pi f) - \cos(2\pi \theta_n)|$$

$$= |E(f)|$$

where a superscript asterisk denotes complex-conjugation and $$E(f) = |H_P(f)| 2^{Q_S} \prod_{n=0}^{Q_S-1} (\cos(2\pi f) - \cos(2\pi \theta_n)). \quad (11)$$

The product on the right hand side of equation (11) defines a $Q_S$ order polynomial in $\cos(2\pi f)$. Hence, we can rewrite equation (11) as $$E(f) = |H_P(f)| \left( 2^{Q_S}\cos^{Q_S}(2\pi f) - \sum_{n=0}^{Q_S-1} p'_n \cos^n(2\pi f) \right) \quad (12)$$

where the weights $p'_n, n=0,1, \ldots Q_S-1$ could if desired be computed from the zero frequencies $\theta_0, \theta_1, \ldots, \theta_{Q_S-1}$. There is no need for this mapping, however, so we need not be concerned with its precise functional form. Trigonometric identities allow rewriting $$2^{Q_S}\cos^{Q_S}(2\pi f) = 2\cos(2\pi Q_S f) + \sum_{n=0}^{Q_S-1} a_n \cos^n(2\pi f) \quad (13)$$

where again the weights $a_n$ could be calculated but are of no consequence for what follows. Using the expansion (13), we finally obtain $$E(f) = |H_P(f)| \left( 2\cos(2\pi Q_S f) - \sum_{n=0}^{Q_S-1} p_n \cos^n(2\pi f) \right) \quad (14)$$

or $$E(f) = W(f)(D(f) - P(f)) \quad (15)$$

with the obvious definitions for the weighting function $W(f)$, the desired function $D(f)$, and the polynomial $P(f)$.

If $Z_S$ is odd, we can again reach the general function form (15). The only difference is that the weighting $W(f)$ is now given by $$W(f) = |H_P(f)| 2\cos(\pi f) \quad (16)$$

The reason for expressing $E(f)$ in the form (15) is that the problem is now within the framework of the Hofstetter et al. procedure noted above and their Remez-exchange like technique can be used. The application here is even slightly simpler than theirs, because the region over which the maximum is taken in the equation defining $\delta$, that is, equation (4), is one continuous interval on the real line, whereas in the Hofstetter et al. application, it is composed of two or more disjoint intervals, which introduces complication.

For filters with less than about 500 taps we were able to successfully use either the barycentric or the standard forms of the Lagrange interpolating polynomial. However, for larger filters we frequently encountered difficulties when using the barycentric form recommended by Hofstetter et al.

Passband Zero Location

Passband zeros are located by finding the free parameter vector $\lambda$, minimizing $J(z_P(\lambda), z_S)$ where $z_S$ is fixed for the optimization. The best way to search for this minimizing vector is necessarily highly dependent on the particular cost function of interest. For the cost function of the example given below, it has been found that the Powell algorithm noted above performs satisfactorily. This particular algorithm does not require any gradient information.

Application to Subband Echo Canceler

Our particular application of Z-plane alternation has been to the design of the X and Y filters in X and Y analysis filter banks 103 and 105 and the E filters in E synthesis filter bank 112 for subband echo canceling.

As indicated above, FIG. 1 is a block diagram of an M-band subband echo canceler 100. The signal x(k) is tapped on its way to some unknown echo path $h_{PATH}(k)$ 102. This tapped signal is decomposed into M subband signals $x_m(k), k=0,1, \ldots M-1$ in X analysis filter bank 103. The $m^{th}$ such signal is created by first heterodyning down by $e^{-j2\pi mk}$ and then filtering with the low-pass filter $g_X(k)$, that is, $$x_m(k) = g_X(k) * e^{-j2\pi mk} x(k), \quad (17)$$

where the raised * denotes convolution.

The signal y(k) is the sum of the echo from echo path 102 and any desired speech v(k) from the local end. The signal y(k) is also decomposed into M subband signals, but importantly, the prototype low-pass filter $g_Y(k)$ used in the Y analysis filter bank 105 need not be the same as the prototype low-pass filter used in the X analysis filter bank 103.

In each band m the signals $x_m(k)$ and $y_m(k)$ are subsampled by S<M. Critical rate sampling, that is, S=M, is in principle possible, but in practice a poor idea. An article authored by A. Gilloire and M. Vetterli, entitled "Adaptive filtering in subbands with critical sampling: Analysis, experiments, and application to acoustic echo cancellation", *IEEE Transactions Signal Processing*, vol. 40, pp. 1862–1875, August 1992. Also, because there is a subtraction of an echo estimate $\hat{y}_m(s)$ from the echo $y_m(s)$, quadrature-mirror filtering in which aliasing in one band cancels that from another is not possible. Thus, the filters $g_X(k)$ and $g_Y(k)$ must cutoff by at least the frequency 0.5/S.

In each of the M bands the subsampled signals $x_m(s)$ and $y_m(s)$ drive an adaptive filter (echo canceler) to produce a subsampled error signal $e'_m(s)$. This signal is interpolated with zeros to form $e_m(k)$, which is then filtered by a low-pass filter $g_E(k)$ and heterodyned up by $e^{j2\pi mk}$. All M such signals are then added to form the full-band signal e(k). Thus $$e(k) = \sum_{m=0}^{M-1} e^{j2\pi mk}(g_E(k) * e_m(k)). \quad (18)$$

Let $G_X(f)$ denote the Fourier transform of $g_X(k)$, that is, $$G_X(f) = \sum_{k=0}^{N_X-1} g_X(k) e^{-j2\pi fk}, \quad (19)$$

and similarly define $G_Y(f)$ and $G_E(f)$. If the echo estimates $\hat{y}_m(s)$ are all zero, the lower half of the echo canceler structure of FIG. 1 becomes simply an analysis/synthesis subband filter bank. Assuming the filters $g_Y(k)$ (not shown)

and filters $g_E(k)$ 501 (FIG. 5) to have reasonable stopband attenuation so that aliasing is negligible, the transfer function $T(f)$ from $y(k)$ to $e(k)$ is expressible by $$T(f) = \sum_{m=0}^{M-1} G_Y(f - m/M) G_E(f - m/M). \quad (20)$$

We have always chosen the E filters in E synthesis filter bank 112 to be identical to the Y filters in Y analysis filter bank 105, in which case, equation (20) becomes $$T(f) = \sum_{m=0}^{M-1} G_Y^2(f - m/M). \quad (21)$$

In echo canceling it is desirable that there be as little delay as possible in the $y(k)$ to $e(k)$ path. For filter banks as large as about M=32 the best filters seem to be minimum phase filters, since, they have the least possible delay and the human ear is insensitive to the phase distortion they introduce (Ohm's Law). However, when M is greater than 32, we have found experimentally that the phase distortion of minimum phase filters starts to become noticeable. Hence, linear phase filters are more desirable in certain applications if M is to be a very large number. The description here will continue under the assumption that m is no larger than 32 and minimum phase filters are desired. It is noted that linear phase filter design is similar and in fact, somewhat simpler than the minimum phase filter design.

The function $T(f)$ is periodic every 1/M Hertz. A cost function $$J(z_P(\lambda), z_S) = \min_{\alpha} \max_{f \in [0, 0.5/M]} \alpha |T(f)| - 1 \quad (22)$$

is probably the most natural to use. The cost it assigns is the error at the worst frequency with the best possible scaling. Unfortunately, this particular cost function is bumpy (on a very small scale) when parameterized in the Z-plane. The optimization procedure quickly becomes stuck in a local minimum. Instead of (22), we have used $$J(z_P(\lambda), z_S) = \int_0^{0.5/M} (T_{dB}(f) - \alpha_{dB})^2 df \quad (23)$$

where $$T_{dB}(f) = 20\log_{10}(|T(f)|) \quad (24)$$

and $$\alpha_{dB} = 2M \int_0^{0.5/M} T_{dB}(f) df. \quad (25)$$

With this cost function, we have not been troubled by local minima.

Let $N_Y$ denote the number of taps in the FIR filter $g_Y(k)$ and let $Z_{Y,P}$ and $Z_{Y,S}$ denote the number of passband and stopband zeros. Necessarily, $$Z_{Y,P} + Z_{Y,S} = N_Y - 1. \quad (26)$$

In searching the Z-plane for optimal locations for passband zeros we assume there is one real-axis zero if $Z_{Y,P}$ is odd and none otherwise. The zeros off the real axis must come in complex-conjugate pairs as the impulse response is to be real. We achieve a minimum delay (minimum phase) filter by not allowing any of the zeros to migrate outside the unit circle during the search.

Figure 9:
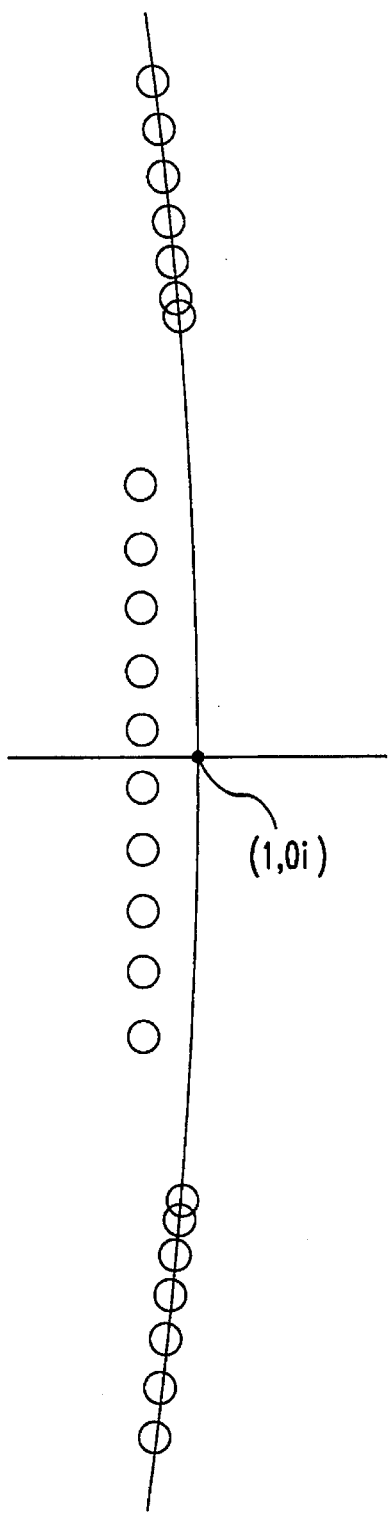
FIG. 9 shows a small section of the Z complex plane unit circle illustrating zeros for the Y filters in the Y analysis filter bank of FIG. 1.

One such filter designed with this unique procedure is a 680 tap filter with M=54, S=40, $Z_{Y,P}$=10, $Z_{Y,S}$=669, $f_{Y,P}$= 0.009259 and $f_{Y,S}$=0.01169 where $f_{Y,P}$ and $f_{Y,S}$ are the upper limit of the passband and lower limit of the stopband for this Y filter. A plot of the passband zeros as well as some of the closer-in stopband zeros appears in FIG. 9. The stopband zeros not shown continue around the unit circle with increasingly regular spacing as −1 is approached. The worst case rejection is 59.89 dB and the peak-to-peak ripple in $T(f)$ is 0.20 dB. The delay of the Y filter is 109.30 samples. Note that this is only about one third the 340 sample delay of a 680 tap linear phase filter.

In designing the Y filter, we seeded the passband zeros to be equally spaced in frequency over $[-f_{Y,P}, f_{Y,P}]$ and to be in from the unit circle a distance equal to the angular spacing. The initial guess for the Remez-exchange extremals spaced them uniformly over $[f_{Y,S}, 0.5]$.

The cutoff frequency $f_{Y,S}$=0.01169 in the above design of the Y filters in Y analysis filter bank 105 is not equal to 0.5/S as might be expected. Rather it has been chosen as of the way out to 0.5/S from 0.5/M. The reason for moving the cutoff frequency in like this is because of the importance of making the pass-band of filter $G_Y(f)$ somewhat narrower than $G_X(f)$ as indicated above. For this to be possible, $G_Y(f)$ must roll off faster than a simple consideration of aliasing alone would dictate. It is also noted that it is extremely important to have the passband zeros of $g_X(k)$ duplicate as much as possible the passband zeros of $g_Y(k)$. We force this by allowing the passband zero structure of $g_X(k)$ to differ from that of $g_Y(k)$ by only the addition of one extra pair of complex-conjugate zeros.

Figure 10:
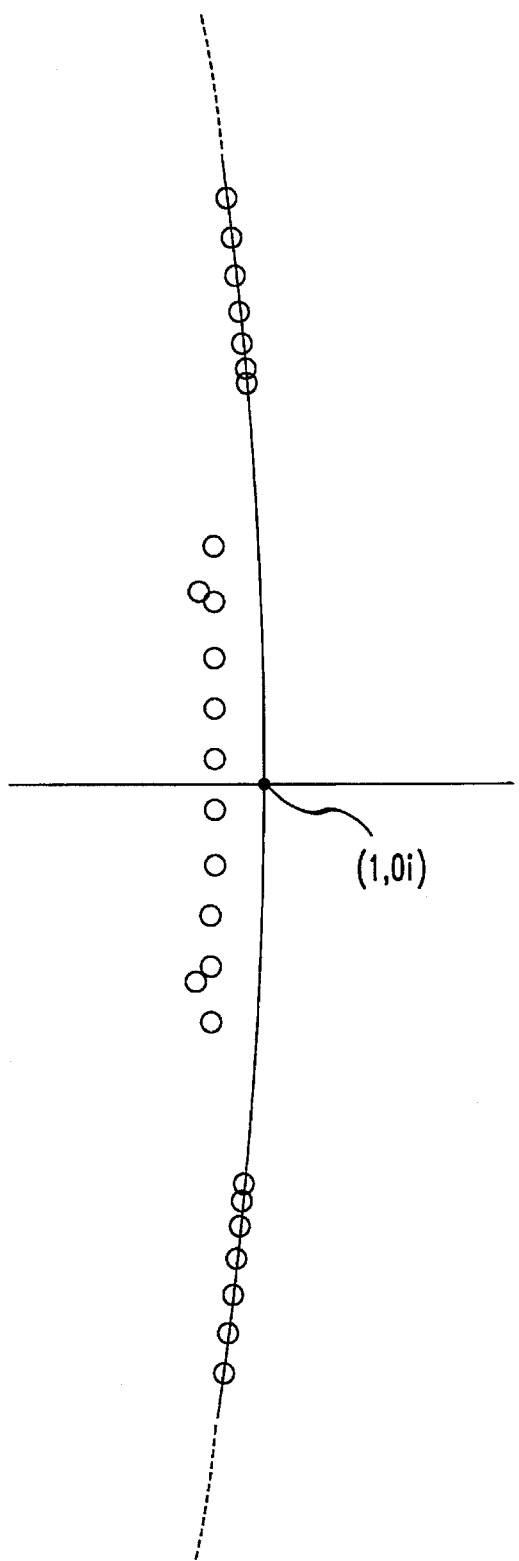
FIG. 10 shows a small section of the Z complex plane unit circle illustrating zeros for the X filters in the X analysis filter bank of FIG. 1.

The X filters in X analysis filter bank 103 are designed to mate with the above Y filters in Y analysis filter bank 105 and has the zero locations shown in FIG.10. The worst case rejection is 59.06 dB and the filter delay is 102.16 samples.

In designing this X filter there were only two degrees of freedom: the radius and angle of the additional complex-conjugate pair of zeros. Because there is no requirement for a smooth folded response as in equation (21), the cost function was changed to $$J(z_P(\lambda), z_S) = \int_0^{f_{X,P}} G_{X,dB}^2(f) df \quad (27)$$

where $$G_{X,dB}(f) = 20\log_{10}(\alpha|G_X(f)|) \quad (28)$$

and the scaling $\alpha$ is set by $$\alpha = \frac{1}{f_{X,P}} \int_0^{f_{X,P}} G_{X,dB}(f) df. \quad (29)$$

The upper limit $f_{X,P}$ on the passband was set at of the way out to 0.5/S from 0.5/M and the stopband lower limit $f_{X,S}$ was set to the aliasing dictated 0.5/S. Because the passband has two more zeros than before, it was also necessary to add a few more stopband zeros to keep the stopband loss of $G_X(f)$ about equal to that of $G_Y(f)$. Actual numbers used in designing $g_X(k)$ were M=54, S=40, $N_X$=720 $Z_{X,P}$=12, $Z_{X,S}$= 707, $f_{X,P}$=0.01007, and $f_{X,S}$=0.01250.

In designing this X filter, the initial guess for the Remez-exchange extremals was the same as in the Y filter design. The one additional complex pair of passband zeros was seeded to be the same distance from the unit circle as the highest frequency pair in the Y filter and at a frequency equal to the sum of the frequency of the highest pair and $f_{X,P} - f_{Y,P}$. As can be seen in FIG. 10, the optimization moved this additional complex pair a considerable distance from the seeded location. Other X filters of this sort but with different cutoffs and numbers of stopband zeros and passband zeros generally also have the additional complex pair moved a long distance from the seeded location, but exactly where and even what direction depends in a strange way on particular numbers.

I claim:

1. A subband echo canceler comprising:
  a first analysis filter bank including a predetermined number of first filters for establishing a predetermined number of subbands and for decomposing a received signal into a corresponding number of subband signals, each of the first filters having a predetermined first frequency passband;
  a second analysis filter bank including a predetermined number of second filters equal to the predetermined number of the first filters for establishing a corresponding number of subbands and for decomposing a transmit signal into the predetermined number of subband signals, each of the second filters having a predetermined second frequency passband which is narrower than the first frequency passband;
  a plurality of echo cancelers supplied with the subband signals from the first analysis filter and the subband signals from the second analysis filter for canceling echoes in the corresponding subbands and for generating a predetermined number of error signals equal to the predetermined number of subbands; and
  a synthesis filter bank supplied with the predetermined number of error signals for synthesizing an output signal.

2. The subband echo canceler as defined in claim 1 wherein each of the first filters includes a first analysis prototype filter and first heterodyning apparatus for heterodyning down the frequency of the received signal and wherein each of the second filters includes a second analysis prototype filter and second heterodyning apparatus for heterodyning down the frequency of the transmit signal.

3. The subband echo canceler as defined in claim 2 wherein the first and second analysis prototype filters are finite impulse response (FIR) filters.

4. The subband echo canceler as defined in claim 2 wherein the synthesis filter bank includes a predetermined number of third filters equal to the predetermined number of the first filters for establishing a corresponding number of subbands and for recomposing the error signals from the predetermined number of subbands into the output signal, each of the third filters having a predetermined third frequency passband.

5. The subband echo canceler as defined in claim 4 wherein each of the third filters includes a synthesis prototype filter which yields a filtered version of a corresponding error signal and third heterodyning apparatus for heterodyning up the frequency of the filtered version of the corresponding error signal and combining apparatus for combining the heterodyned up filtered versions of the error signals to yield the output signal.

6. The subband echo canceler as defined in claim 5 wherein each of the synthesis prototype filters is an finite impulse response (FIR) filter.

7. The subband echo canceler as defined in claim 1 wherein each of the first filters has a first frequency response band and each of the second filters has a second frequency response band and wherein said first and second frequency response bands substantially do not overlap each other.

8. The subband echo canceler as defined in claim 1 wherein each of the first filters has a first frequency response band and each of the second filters has a second frequency response band and wherein said first and second frequency response bands overlap each other.

9. The subband echo canceler as defined in claim 8 wherein the overlap of the first frequency response band and the second frequency response band substantially occurs between a roll-off frequency of the second filters and approximately a cut-off frequency of the first filters.

10. The subband echo canceler as defined in claim 9 wherein the frequency response of each of the second filters begins to roll-off approximately at frequency and cuts-off approximately at a frequency approximately two thirds of the way between the roll-off frequency of the second filters and cut-off frequency of the first filters and the frequency response of each of the first filters begins to roll-off at a frequency approximately one third of the way between roll-off frequency of the second filters and cut-off frequency of the first filters and cuts-off at approximately cut-off frequency.

11. The subband echo canceler as defined in claim 1 wherein each of the first filters and each of the second filters has a plurality of complex passband zeros arranged in complex conjugate pairs and a number of real zeros.

12. The subband echo canceler as defined in claim 11 wherein the number of real zeros is zero.

13. The subband echo canceler as defined in claim 11 wherein the number of real zeros is one.

14. The subband echo canceler as defined in claim 11 wherein each of the first filters has a predetermined number of bandpass zeros and each of the prototype filters has a predetermined number of complex passband zeros arranged in complex conjugate pairs, and a number of real zeros.

15. The subband echo canceler as defined in claim 14 wherein a predetermined number of the complex conjugate pairs of passband zeros is the same for the first filters and the second filters.

16. The subband echo canceler as defined in claim 14 wherein a predetermined number of the complex conjugate pairs of passband zeros is the same for the first filters and the second filters and wherein an outermost complex conjugate pair of the passband zeros in the first analysis prototype filters is different from an outermost complex conjugate pair of passband zeros of the second filters.

17. The subband echo canceler as defined in claim 14 wherein the predetermined number of the complex conjugate pairs of passband zeros in said first filters is greater than the predetermined number of complex conjugate pairs of zeros in the second filters.

18. The subband echo canceler as defined in claim 14 wherein the predetermined number of the complex conjugate pairs of passband zeros in said first filters is greater by one complex conjugate pair of zeros than the predetermined number of complex conjugate pairs of zeros in the second filters.

19. The subband echo canceler as defined in claim 11 wherein each of the first filters includes a first analysis prototype filter and first heterodyning apparatus for heterodyning down the frequency of the received signal and wherein each of the second filters includes a second analysis prototype filter and second heterodyning apparatus for heterodyning down the frequency of the transmit signal.

* * * * *